United States Patent
Huang et al.

(10) Patent No.: US 9,735,238 B2
(45) Date of Patent: Aug. 15, 2017

(54) AVOIDING INTERNAL SWITCHING LOSS IN SOFT SWITCHING CASCODE STRUCTURE DEVICE

(71) Applicant: Virginia Tech Intellectual Properties, Inc., Blacksburg, VA (US)

(72) Inventors: Xiucheng Huang, Blacksburg, VA (US); Weijing Du, Blacksburg, VA (US); Qiang Li, Blacksburg, VA (US); Fred C. Lee, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 2 days.

(21) Appl. No.: 14/471,404

(22) Filed: Aug. 28, 2014

(65) Prior Publication Data
US 2015/0200583 A1    Jul. 16, 2015

Related U.S. Application Data

(60) Provisional application No. 61/927,516, filed on Jan. 15, 2014.

(51) Int. Cl.
*G05F 1/00* (2006.01)
*H01L 29/20* (2006.01)
(Continued)

(52) U.S. Cl.
CPC .......... *H01L 29/20* (2013.01); *H01L 29/1608* (2013.01); *H03K 17/102* (2013.01);
(Continued)

(58) Field of Classification Search
CPC ... H01L 29/20; H01L 29/1608; H03K 17/102; H03K 17/567; H03K 2217/0036; H03K 2017/6875; H02M 2001/0058; H02M 1/083
USPC .......................................... 323/222, 235, 319
See application file for complete search history.

(56) References Cited

U.S. PATENT DOCUMENTS 6,483,369 B1 * 11/2002 Wittenbreder, Jr. ....................... H03K 17/04163
327/427
2002/0153938 A1 * 10/2002 Baudelot ............... H01L 27/098
327/430

(Continued)

FOREIGN PATENT DOCUMENTS

JP            201561265       * 9/2013

*Primary Examiner* — Alex Torres-Rivera
(74) *Attorney, Agent, or Firm* — Whitham, Curtis & Cook, P.C.

(57) ABSTRACT

In a cascode switching device, avalanche breakdown of a control transistor and loss of soft switching or zero voltage switching in a high voltage normally-on depletion mode transistor having a negative switching threshold voltage and the corresponding losses are avoided by providing additional capacitance in parallel with a parallel connection of drain-source parasitic capacitance of the control transistor and gate-source parasitic capacitance of the high voltage, normally-on transistor to form a capacitive voltage divider with the drain-source parasitic capacitance of the high voltage, normally-on transistor such that the avalanche breakdown voltage of the control transistor cannot be reached. The increased capacitance also assures that the drain source parasitic capacitance of the high voltage, normally-on transistor is fully discharged before internal turn-on can occur.

16 Claims, 9 Drawing Sheets

(51) Int. Cl.
  *H01L 29/16* (2006.01)
  *H03K 17/10* (2006.01)
  *H03K 17/567* (2006.01)
  *H02M 1/00* (2006.01)
  *H03K 17/687* (2006.01)

(52) U.S. Cl.
  CPC ... *H03K 17/567* (2013.01); *H02M 2001/0058* (2013.01); *H03K 2017/6875* (2013.01); *H03K 2217/0036* (2013.01); *Y02B 70/1491* (2013.01)

(56) References Cited

U.S. PATENT DOCUMENTS

| | | | | |
|---|---|---|---|---|
| 2011/0199148 A1* | 8/2011 | Iwamura | ............... | H03K 17/567 327/430 |
| 2013/0335134 A1* | 12/2013 | Kanazawa | .......... | H01L 27/0883 327/404 |
| 2014/0021934 A1* | 1/2014 | Wu | ....................... | H02M 3/156 323/311 |
| 2014/0231829 A1* | 8/2014 | Kanazawa | .......... | H01L 21/8213 257/77 |
| 2015/0061752 A1* | 3/2015 | Abe | ................. | H03K 17/08122 327/427 |
| 2015/0069469 A1* | 3/2015 | Saito | ................... | H01L 27/0605 257/194 |
| 2015/0084685 A1* | 3/2015 | Hirose | ................ | H03K 17/302 327/382 |
| 2015/0303806 A1* | 10/2015 | Madsen | ............... | H02M 3/158 323/271 |

* cited by examiner

AVOIDING INTERNAL SWITCHING LOSS IN SOFT SWITCHING CASCODE STRUCTURE DEVICE

CROSS-REFERENCE TO RELATED APPLICATIONS

This application claims benefit of priority of U.S. Provisional Application 61/927,516, filed Jan. 15, 2014, which is hereby incorporated by reference in its entirety.

FIELD OF THE INVENTION

The present invention generally relates to power converters and switching devices used therein and, more particularly to the construction and operation of cascode devices used for high current switching and techniques and circuits for substantially eliminating switching losses therein.

BACKGROUND OF THE INVENTION

High performance semiconductor switching devices have enabled substantial increases in power density in power converters. Switching devices formed from silicon have dominated the power management field for the past fifty to sixty years and much optimization of such devices has been accomplished during that period. However, the material properties of silicon are currently limiting further improvement in switching devices made from silicon. Therefore, high current switching devices made from wide band-gap material such as silicon carbide (SiC) and nitrides of Group III semiconductor materials such as gallium nitride (GaN) have emerged as promising devices for high voltage, high frequency, high efficiency and high power density power conversion with low on-state resistance.

The wide band-gap devices can be categorized into two types defined by their operation mode: enhancement mode (normally off) and depletion mode (normally on). The depletion mode switches usually have a lower on-resistance and a smaller junction capacitance than the enhancement mode switches and therefore are deemed more attractive for applications that require high efficiency at a higher frequency. Such transistors are referred to as high voltage, normally-on transistors. The threshold voltage for depletion mode devices is negative. Therefore, a depletion mode device with a low voltage silicon MOSFET or transistor having similar characteristics for controlling the depletion mode device is an appealing alternative to other types of transistor switches. Such a configuration is known as a cascode structure.

In high voltage (e.g. greater than 400V) and high frequency (e.g. above about 100 KHz) applications, turn-on switching losses in power devices are significant and so-called soft switching or zero voltage switching (ZVS) turn-on is required for pursuing high efficiency. The fundamental principle of ZVS turn-on is to provide resonance between a circuit inductance and a (possibly parasitic) capacitance and use the resonant current to discharge the junction capacitance of the high voltage switching device to zero volts prior to the arrival or assertion of the driving signal or internal turn-on occurs. While it is most simple and preferred to use resonant current to achieve ZVS, the negative current to discharge the junction or other parasitic capacitance can be provided in other ways such as an induced current. Therefore, in using ZVS, parasitic capacitances are of substantial importance to assure that the capacitance is fully discharged prior to the next turn-on instant. If the capacitance is not fully discharged before turn-on, the capacitance will be discharged through the conduction channel of the high voltage device, causing significant losses.

Unfortunately, the voltage distribution between the silicon MOSFWT (Si-MOSFET) and high voltage normally-on device in the cascode structure may result in internal switching loss even when it is intended to operate under ZVS conditions. In a cascode connection, when the charge of the drain-source parasitic capacitance of the normally-on high voltage device is larger than the sum of the drain-source parasitic capacitance of the silicon FET and the gate-source parasitic capacitance of the high voltage device, it will prevent full discharge of drain source parasitic capacitance of the high voltage device during what would otherwise be a ZVS turn-on transition which causes internal losses. Moreover, such a charge imbalance will generally drive the drain-source voltage of the silicon MOSFET above the avalanche breakdown voltage, causing further losses, and operation in a mode which is not recommended and which thermally compromises the cascode-connected device. Therefore some of these devices have not been suitable for high frequency operation in a desirable cascode connection switching device.

SUMMARY OF THE INVENTION

It is therefore an object of the present invention to provide a technique and cascode circuit connection which unconditionally achieves ZVS operation and avoids avalanche conditions regardless of the magnitude of the drain-source parasitic capacitance of the high voltage depletion mode transistor.

It is another object of the invention to provide a cascode structure in which all types of high voltage normally-on transistors are suitable for high frequency operation.

In order to accomplish these and other objects of the invention, a cascode switching device and a power converter including a cascode switching device are provided in which the cascode switching device comprises a high voltage, normally-on transistor formed of silicon carbide or a nitride of a Group III semiconductor material such as gallium nitride (GaN) having a drain-source parasitic capacitance, a source-gate parasitic capacitance and a gate-drain parasitic capacitance, a control transistor for controlling conduction of the high voltage, normally-on transistor, having an avalanche breakdown threshold voltage, a drain-source parasitic capacitance, a source-gate parasitic capacitance and a gate-drain parasitic capacitance, and a charge balancing capacitor connected in parallel with a parallel connection of the gate-source parasitic capacitance of the high voltage, normally-on transistor and the drain-source parasitic capacitance of the control transistor and having a value such that a voltage on the drain-source parasitic capacitance of the control transistor cannot reach the avalanche breakdown threshold voltage when the drain-source parasitic capacitance of the high voltage, normally-on transistor is charged when the high voltage, normally-on transistor is turned off and such that said drain-source parasitic capacitance of the power transistor is fully discharged when voltage on the drain-source parasitic capacitance of the control transistor is discharged to the switching threshold voltage of the high voltage normally-on transistor.

In accordance with another aspect of the invention, a method of operating a cascode switching device is provided including steps of applying a switching signal to a control transistor to charge a drain-source parasitic capacitance and a capacitor connected in parallel with the source-drain parasitic capacitor to a voltage above a switching threshold of a high voltage, normally-on transistor, charging a source-drain parasitic capacitance of the high voltage, normally-on transistor, discharging said source-drain parasitic capacitor to zero volts, and maintaining voltage on the source-drain parasitic capacitance of the control transistor at or above the switching threshold of the high voltage, normally-on transistor with charge on the capacitor until discharging of the source-drain parasitic capacitor to zero volts is complete.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
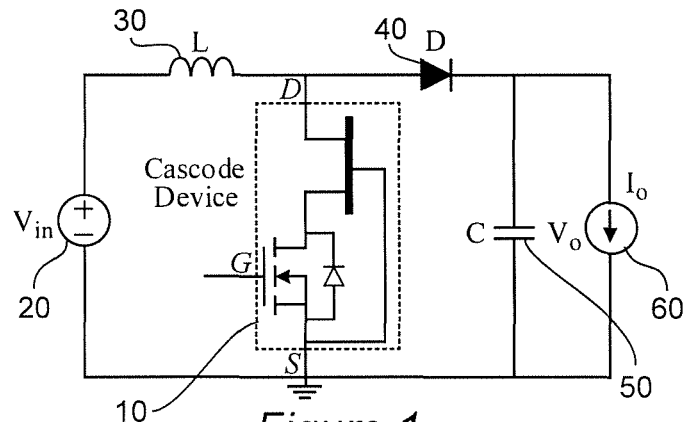
FIG. 1 is a schematic diagram of an exemplary boost DC/DC converter using a cascode device as the switching device.

Referring now to the drawings, and more particularly to FIG. 1, there is shown an exemplary boost converter using a cascode switching device 10. It should be understood that a boost converter is illustrated for simplicity of visualizing and explaining the problem addressed by the invention particularly as discussed in connection with FIGS. 8B and 8C below since only one switching device is employed and interactions of cascode switching devices and the parasitic capacitances they contain need not be considered. While boost converters using simple transistor switches and which operate in the same manner as the circuit of FIG. 1 are known, no portion of FIG. 1 is admitted to be prior art in regard to the present invention and FIG. 1 is, accordingly, labeled as "Related Art".

As is known, a boost converter operates by drawing current from power source 20 through an inductor 30 when switch 10 is closed. Increasing current in the inductor causes a voltage across the inductor which opposes the increase in current. When switch 10 is then opened, the current decreases and the voltage developed across inductor 30 is added to the voltage of the input power source 20 causing a current flow through diode 40 to filter capacitor 50 and load 60. When the switch is again closed and the voltage across the switch reduced, reverse flow of current is prevented by diode 40. Therefore, a boost converter is capable of developing a voltage greater than the voltage of the input power source. The output voltage may be regulated by simple pulse width modulation (PWM) at a relatively high switching frequency in any of a number of ways known in the art. A relatively high switching frequency is preferred for reduced ripple voltage (and required filter capacitance reduction for a given ripple voltage specification) and power density. However some switching losses are inevitably present and are increased with increased switching frequency. Therefore, the relatively high frequency chosen is a trade-off between these effects. Additionally, as alluded to above, zero voltage switching (ZVS) involves use of resonant currents circulating between the inductor and capacitances in the converter circuit. Thus, parasitic capacitances in the cascode switch have a significant effect on operation of the cascode switch.

Figure 2:
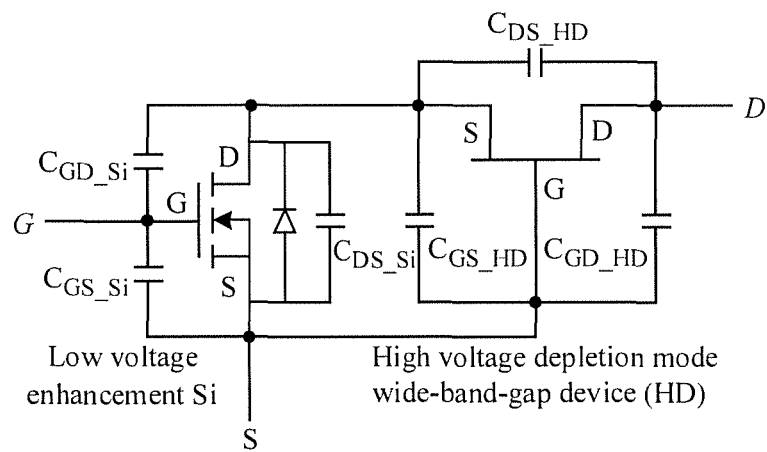
FIG. 2 is a schematic diagram of a cascode connected switching device including all parasitic capacitors.

FIG. 2 is a schematic diagram of the cascode switch of FIG. 1 with all of the parasitic capacitances of the low-voltage transistor, hereinafter referred to as a Si-MOSFET although other materials and types of transistor are usable, and the SiC or GaN transistor, referred to hereinafter as a high voltage transistor since other materials and types of transistors may be suitable. The mode(s) of operation of the cascode switch, as will be discussed below, should also be regarded as exemplary since variations in operation may be presented by charge imbalances in other switch configurations to which the invention may provide a solution. In FIG. 2 and other schematic diagrams herein, the parasitic capacitances are labeled with subscripts in which the first two letters reflect the terminals of each switch between which the parasitic capacitance exists (e.g. the subscript letters "DS" indicate the parasitic capacitance between the drain and source of a transistor) and the last two letters (separated from the first two letters by an underscore, "_") indicate the respective transistor in which the parasitic capacitance being referenced exists (e.g. the letters "Si" indicates the low voltage transistor and "HD" indicates the high voltage, depletion mode transistor (e.g. $C_{DS\_HD}$ indicates the drain-source parasitic capacitance of the high voltage transistor of the cascode switch. The same subscript notation will be used for voltages, This convention in notation will be followed throughout the remainder of the description of the invention.

The problem addressed by the invention may be most readily understood by comparison with the intended mode of operation of the cascode switch in which the parasitic capacitances are well-balanced and which will be discussed initially. The term "well-balanced" refers to a cascode switch in which $C_{DS\_HD}$ is not significantly greater than the sum of $C_{DS\_Si}$ and $C_{GS\_HD}$ such that normal operation will occur and ZVS is possible. The term "significantly greater" should be taken to mean that avalanche breakdown will occur during turn-off of the low voltage transistor and ZVS is precluded, as will be explained below. In the following discussion, it should be kept in mind that transistors principally consume power when transitioning between on and off states (or in avalanche breakdown) when both internal resistance and current flow are significant. Therefore, it will be helpful to observe whether or not voltage changes are described as "rapid". Further, in the following schematic diagrams, the principal conduction paths which are of interest will be depicted in relatively heavier or wider lines while connections and devices that do not carry significant currents will be depicted in relatively lighter, more narrow lines.

Figure 3A:
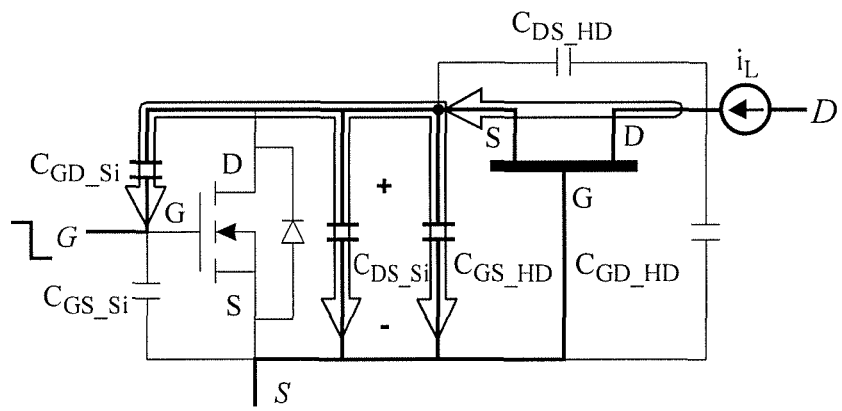
FIGS. 3A and 3B illustrate first and second stages of a turn-off process of a cascode device with balanced parasitic capacitors, respectively.
Figure 3B:
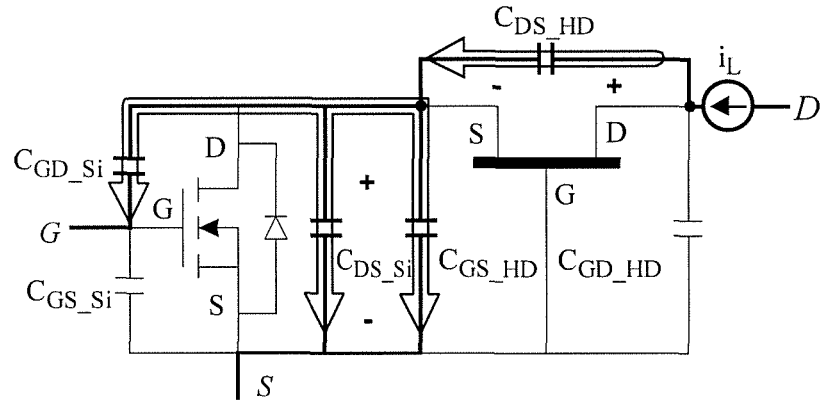

The normal turn-off process of a cascode switch (e.g. having an SiC or GaN high voltage transistor) is performed in two stages, depicted in FIGS. 3A and 3B, respectively. As shown in FIG. 3A, during stage I, the process begins with a turn-off transition in the voltage applied to the gate of the Si MOSFET which turns off first and $C_{DS\_Si}$, $C_{GD\_Si}$ and $C_{GS\_HD}$ are charged in parallel through the channel of the high voltage device until the source-gate voltage ($V_{SG\_HD}$) of the high voltage device rapidly rises to the switching threshold voltage, $V_{TH\_HD}$ whereupon the high voltage device also turn off, as depicted in FIG. 3B.

During stage II, depicted in FIG. 3B, $V_{SG\_HD}$ is greater than $V_{TH\_HD}$ and the high voltage device remains off and $C_{DS\_HD}$ is charged in series with $C_{DS\_Si}$, $C_{GD\_Si}$ and $C_{GS\_HD}$ which essentially becomes a capacitive voltage divider connected to the output voltage of the power converter. Thus, at the end of stage II, if the parasitic capacitances are well-matched, $V_{SG\_HD} = V_{DS\_Si}$ is greater than $V_{TH\_HD}$ but is less than the avalanche breakdown voltage of the Si MOSFET (e.g. the Si MOSFET can be chosen to have a higher avalanche breakdown voltage than $V_{SG\_HD} = V_{DS\_Si}$). At the same time, $V_{DS\_HD}$ rapidly rises from 0V to Vo-$V_{SG\_HD}$ ($=V_{DS\_Si}$) and the turn-off process is complete. In this state, if the parasitic capacitances are well-matched the total charge on $C_{DS\_HD}$ is approximately equal to the total charge on $C_{DS\_Si}$, $C_{GD\_Si}$ and $C_{GS\_HD}$. The charge relationship is $$Q_{CDS\_HD} \cong Q_{CGD\_Si} + Q_{CGS\_HD}. \quad (1)$$

Figure 4A:
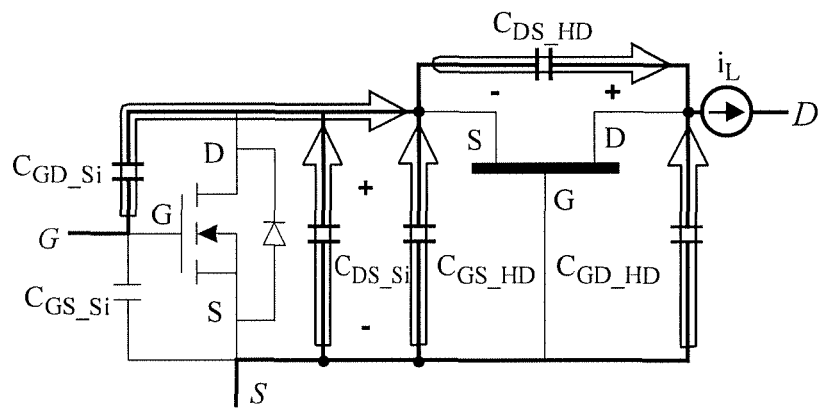
FIGS. 4A and 4B illustrate a ZVS turn-on process of a cascode switching device with balanced parasitic capacitors.
Figure 4B:
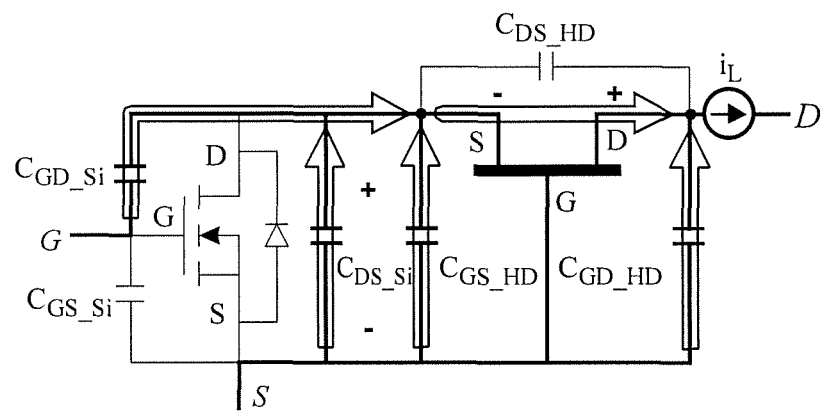

During the soft-switching (turn-on) period, the inductor current decreases to 0 A, and resonates with the parasitic capacitors of the freewheeling diode 40 and the cascode device. FIGS. 4A and 4B illustrate two respective stages of this period denoted as stage III and stage IV, since the turn-off and turn-on operations of the cascode device complete a switching cycle.

In stage III, $C_{DS\_HD}$ is discharged in series with $C_{DS\_Si}$, $C_{GD\_Si}$ and $C_{CGS\_HD}$ by the resonant current and $V_{DS\_Si}$ will decrease to $V_{TH\_HD}$ and, at the same time, $V_{DS\_HD}$ will decrease to 0V due to the charge balance of equation (1), above, and the high voltage device will again begin to conduct under ZVS conditions. During stage IV, the high voltage device is conductive and $C_{DS\_Si}$, $C_{GD\_Si}$ and $C_{GS\_HD}$ are fully discharged through the high voltage device by the resonant current. After both devices have achieved ZVS, a turn-on signal can be applied at any time in accordance with any desired control strategy.

In contrast, if the parasitic capacitances are not well-matched, that is, if the charge on $C_{DS\_HD}$ is much larger than that on $C_{DS\_Si} + C_{GD\_Si}$ or $C_{DS\_Si} + C_{GD\_Si}$ of the chosen Si MOSFET is much smaller, etc., the internal operation of the cascode device will be very different as will now be discussed. The numbering of the stages in a switching cycle differs from that used above in that turn-off and turn-on will occur in three stages each, as depicted in FIGS. 5A-5C and 6A-6C, respectively.

Figure 5A:
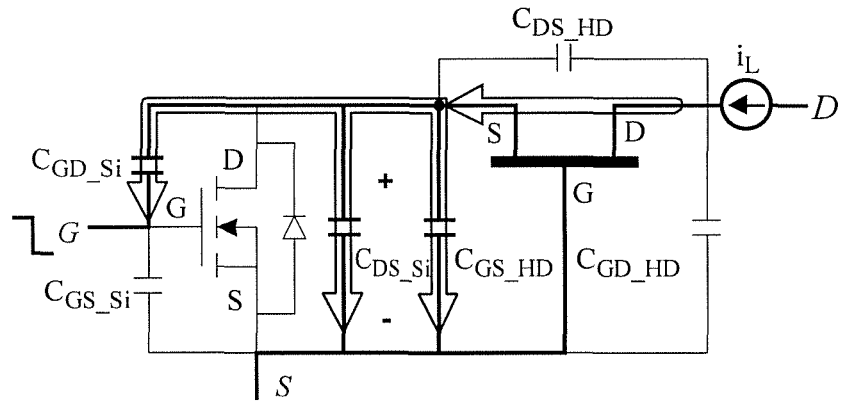
FIGS. 5A, 5B and 5C illustrate a sequence of three stages of a turn-off process of a cascode device having unbalanced parasitic capacitances.
Figure 5B:
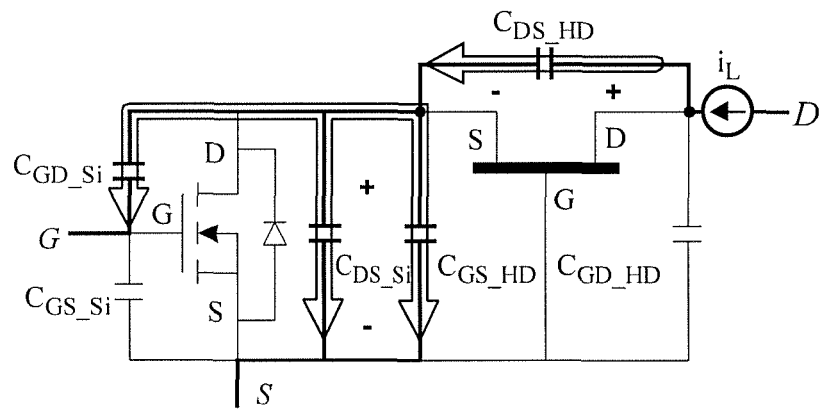
Figure 5C:
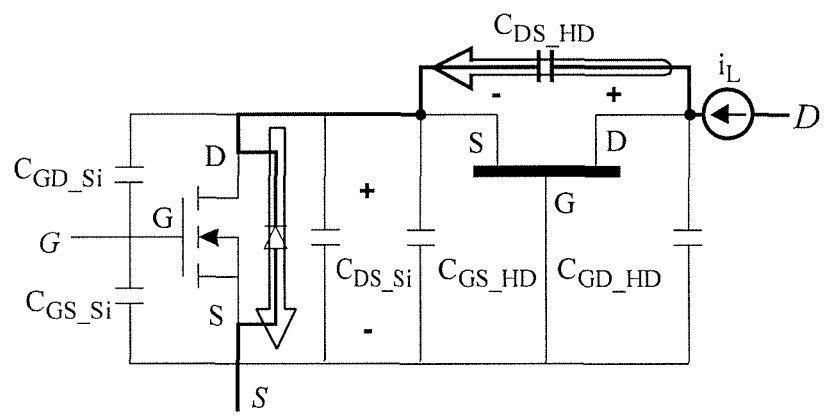

During stage I, the turn-off signal is applied to the gate of the Si MOSFET which turns off first, as before, and $C_{DS\_Si}$, $C_{GD\_Si}$ and $C_{GS\_HD}$ are charged in parallel through the channel of the high voltage device in stage II until $V_{SG\_HD}$ reaches $V_{TH\_HD}$ and the high current device turns off. During stage II, $C_{DS\_HD}$ is charged in series with the parallel connection of $C_{DS\_Si}$, $C_{GD\_Si}$ and $C_{GS\_HD}$ as shown in FIG. 5B. However, because the parasitic capacitors are not well-matched, at the end of stage II, the capacitive voltage divider formed when the high voltage device turns off causes $V_{DS\_Si}$ to be further charged from $V_{TH\_HD}$ to the avalanche voltage of the Si MOSFET, $V_A$, while $C_{DS\_HD}$ is only charged to $V_{DS\_HD}$ where $$V_A + V_{DS\_HD} < V_o$$

because the voltage across a transistor in avalanche breakdown mode is substantially constant as shown in FIG. 5C, illustrating stage III. As further shown in FIG. 5C, $C_{DS\_HD}$ is independently charged through the avalanche path and $V_{DS\_HD}$ will rise from $V_{DS\_HD}$ to Vo-$V_A$ to complete the turn-off process. It should be noted that the current flow through $C_{DS\_HD}$ will compensate the charge decrease due to leakage current. Therefore the voltage stays constant and the charge remains unchanged. Therefore the total charge on $C_{DS\_HD}$ is significantly larger than the charge on $C_{DS\_Si}$, $C_{GD\_Si}$ and $C_{GD\_Si}$ after the high voltage device is turned off. The charge relationship in this case where the parasitic capacitances are unbalanced is $$Q_{CDS\_HD} > Q_{CDS\_Si} + Q_{CGD\_Si} + Q_{CDS\_HD} \quad (2)$$

Figure 6A:
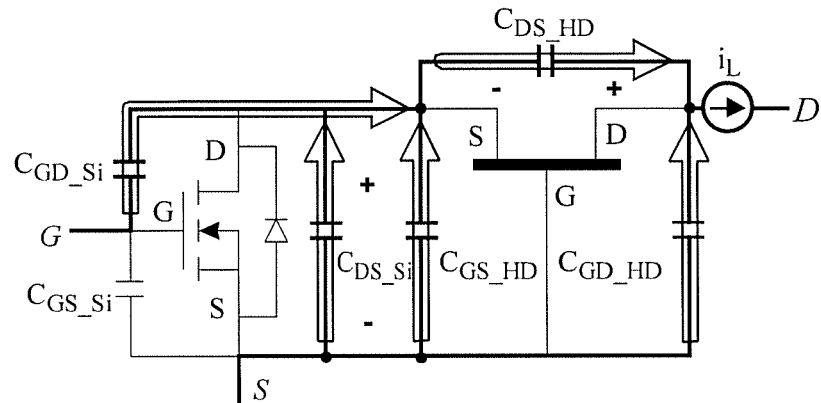
FIGS. 6A, 6B and 6C illustrate a sequence of three stages of what would otherwise be a ZVS turn-on process for a cascode device when the parasitic capacitance are unbalanced.
Figure 6B:
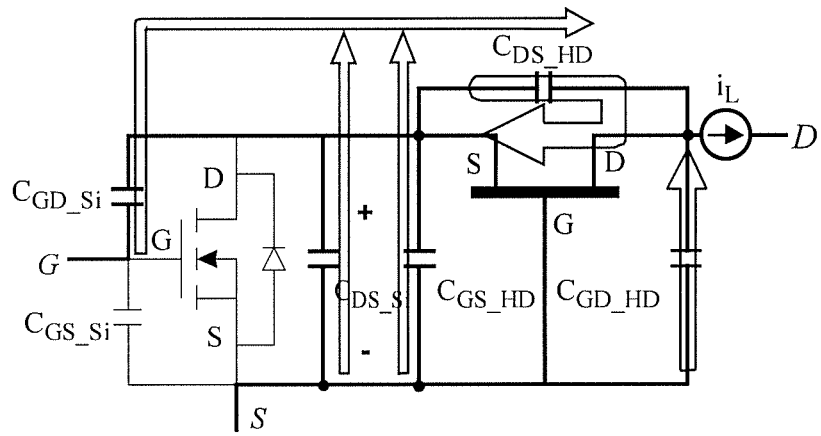
Figure 6C:
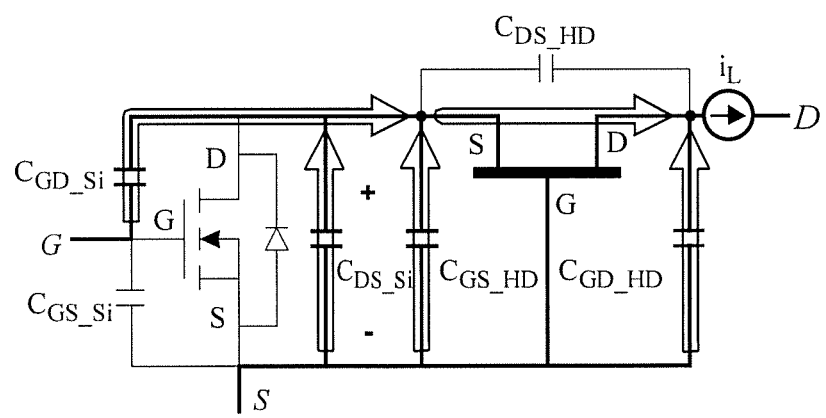

FIGS. 6A-6C shows the very different operation of the cascode device during the turn-on period (corresponding to the soft switching or ZVS turn-on period of FIGS. 4A-4B) due to the unbalanced charge condition resulting from unbalanced or unmatched parasitic capacitances. In stage IV, $C_{DS\_HD}$ is again discharged in series with $C_{DS\_Si}/C_{GD\_Si}$ and $C_{GD\_Si}$ by the resonant current. $V_{DS\_Si}$ decreases from $V_A$ to $V_{TH\_HD}$ and, according to the unbalanced charge relationship in stage II of the turn-off process, $V_{DS\_HD}$ will decrease from Vo-$V_A$ to Vo-$V_A$-$V_{DS\_HD}$ which is greater than zero. At the end of stage IV, when $V_{DS\_Si}$ slowly falls below $V_{TH\_HD}$, the high voltage device begins to turn on with a non-zero source-drain voltage. Therefore the ZVS condition cannot be achieved by the time the high voltage device begins to conduct and ZVS turn-on operation for reduced loss at high frequency is lost.

During stage V, illustrated in FIG. 6B, the high voltage device is turned on and the remaining charge on $C_{DS\_HD}$ is discharged through the conduction channel of the high current device and directly induces further turn-on loss. It should be noted that the high voltage device is turned on internally by the Si MOSFET and no gate signal is required to control turn-on. The terminal voltage on $C_{DS\_HD}$ decreases quickly and, in accordance with Kirchoff's voltage law (KVL) the terminal voltage on $C_{GD\_HD}$ will rapidly decrease, as well. Based on Kirchoff's current law (KCL) the sum of current flow from $C_{DS\_Si}$, $C_{GD\_Si}$, $C_{GS\_HD}$, and $C_{GD\_HD}$ and $C_{GD\_Si}$ should equal the inductor current. Therefore the high currents from the discharge of $C_{GD\_HD}$ cause the discharge of $C_{DS\_Si}$, $C_{GS\_HD}$ and $C_{GD\_Si}$ to be reduced. At the end of stage V the voltage of $C_{DS\_HD}$ returns to 0V while charge remains on $C_{DS\_Si}$, $C_{GS\_HD}$ and $C_{GD\_Si}$ which are discharged during stage VI, illustrated in FIG. 6C.

Thus, in summary, if the parasitic capacitor $C_{DS\_HD}$ is not well-matched (as defined above) with $C_{DS\_Si}$, $C_{GS\_HD}$ and $C_{GD\_Si}$, the Si MOSFET will be driven into avalanche conditions (unless chosen to have a particularly high avalanche breakdown voltage, substantially increasing cost of the cascode switching device) which is not a recommended mode of operation as well as causing losses and compromising thermal behavior of the cascode device as well as causing charge imbalance during the turn-off process. Further, due to the charge imbalance, the high voyage device will lose ZVS capability causing further losses and preventing the cascode device from being used in high frequency applications and deteriorating the thermal condition of the cascode device.

Figure 7:
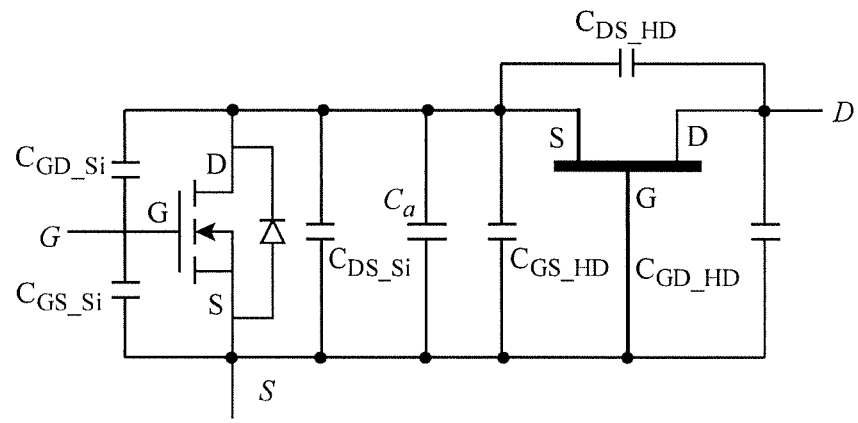
FIG. 7 illustrates addition of a charge balancing capacitor, Ca, to a cascode device in accordance with the invention.

To address the above problem caused by charge imbalance caused by parasitic capacitance imbalance, the invention avoids the capacitor imbalance by addition of a small additional capacitor, Ca in parallel with $C_{DS\_Si}$, $C_{GS\_HD}$ and $C_{GD\_Si}$ to the drain-source of the Si MOSFET as shown in FIG. 7. In order to substantially avoid the avalanche condition, the internal turn-on losses and to achieve high frequency switching capability, the total charge on $C_{GS\_Si}$ and $C_{GS\_HD}$ should be equal to or greater that the charge on $C_{DS\_HD}$ after the high voltage device is turned off. That is, $$Q_{CDS\_HD} \leq Q_{CDS\_Si} + Q_{GCD\_Si} + Q_{CGS\_HD} + Q_{Ca}$$

from which the required value of Ca is given by $$Ca = dQ_{Ca}/dv.$$

where dv is the voltage increase from $V_{TH\_HD}$ to the maximum value of $V_{DS\_Si}$ which is a few volts below the chosen avalanche voltage value of the Si MOSFET. It should be noted, in this regard, that if $Q_{CDS\_HD}$ is not significantly greater than $Q_{CDS\_Si} + Q_{GCS\_HD}$, as defined above, the problem of parasitic capacitor imbalance does not occur. Therefore, if Ca is, in fact, required to avoid the problems of charge imbalance, the value of Ca is not critical if it is at least close to $C_{GS\_HD}$ since some finite parasitic capacitance will exist in the Si MOSFET.

Figure 8A:
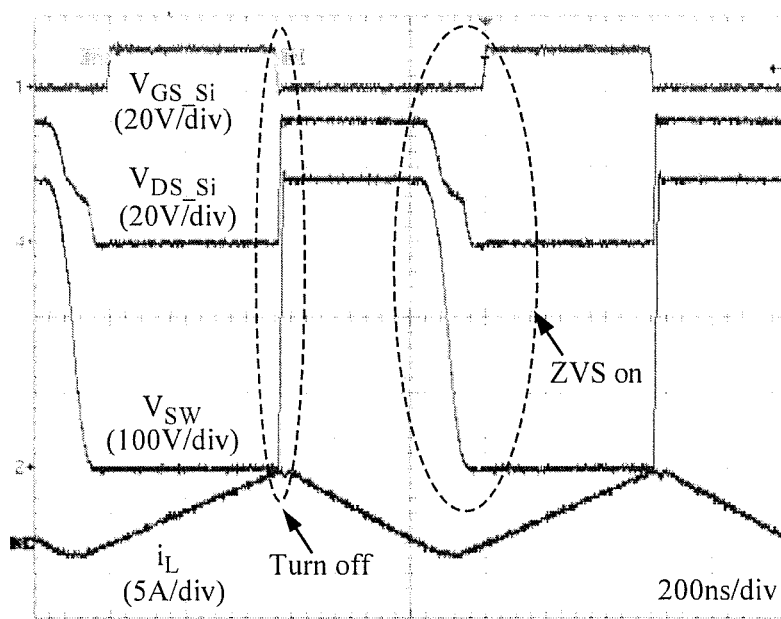
FIG. 8A illustrates experimentally derived waveforms of an unbalanced cascode device without additional capacitor Ca.
Figure 8B:
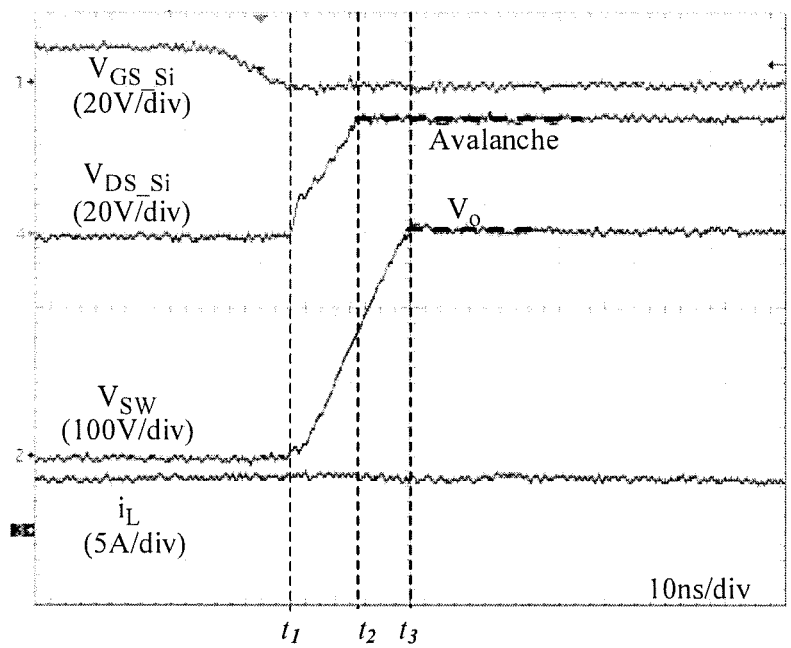
FIGS. 8B and 8C illustrate current and voltage waveforms in FIG. 8A explaining the phenomenon of Si MOSFET avalanche and internal switching losses in the cascode device when parasitic capacitances are unbalanced.
Figure 8C:
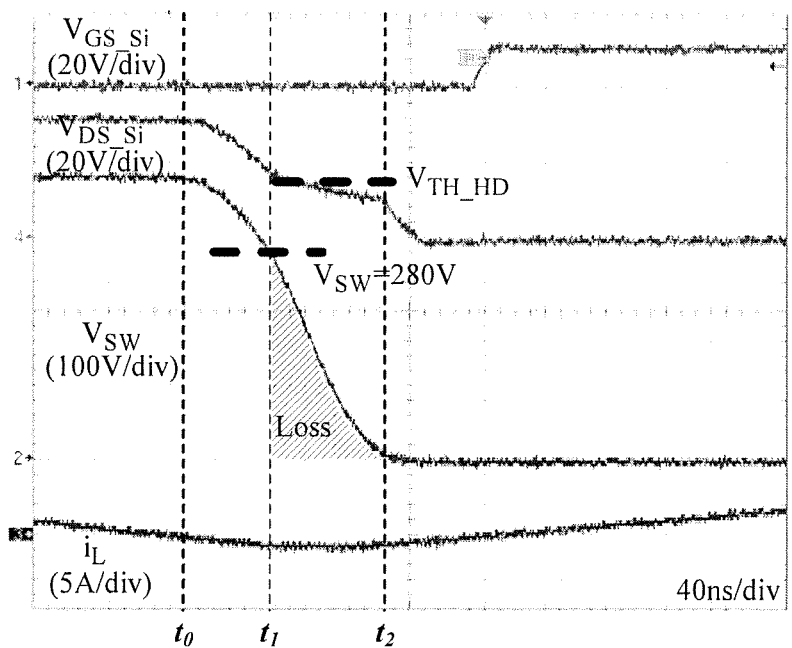

To verify the effectiveness of adding Ca to the cascode switch, FIGS. 8A-8C are experimental waveforms of the cascode device of FIG. 7 but without Ca being connected. Particularly in the magnified view of the turn-off period in FIG. 8B with the turn-off signal being applied at time t1, it is seen that avalanche occurs after discharge of $V_{GS\_Si}$ at time t2 and that $V_{SW}$ reaches Vo only at time t3 when $C_{DS\_HD}$ has been and is being charged continuously through the avalanche path, as described above. FIG. 8C illustrates the following and corresponding turn-on period in the context of the boost converter of FIG. 1. As seen in the experimental waveforms of FIGS. 8A-8C and the expanded view of the turn-on period in FIG. 8C, at time t4, the inductor current decreases to zero and begins to resonate. $C_{DS\_HD}$ starts to discharge in series with $C_{DS\_Si}$, $C_{GD\_Si}$ and $C_{GS\_HD}$. At time t5, the drain-source voltage of the Si MOSFET, which is also the source-gate voltage of the high voltage transistor, decreases to its (negative) switching threshold and the channel begins to turn on. At this point the remaining voltage on $C_{DS\_HD}$ is $V_{SW} - V_{TH}$ which remains high (e.g. 265V). Between t5 and t6 when $V_{GS\_HD}$ is approximately $V_{TH}$, the terminal voltage of $C_{DS\_HD}$ is discharged through the high voltage device channel; inducing internal turn-on loss and slows discharge of $C_{DS\_Si}$ and $C_{GS\_HD}$ by causing reduction of discharge current as described in the above analysis. The loss is illustrated by the shaded area under the $V_{SW}$ waveform.

Figure 9A:
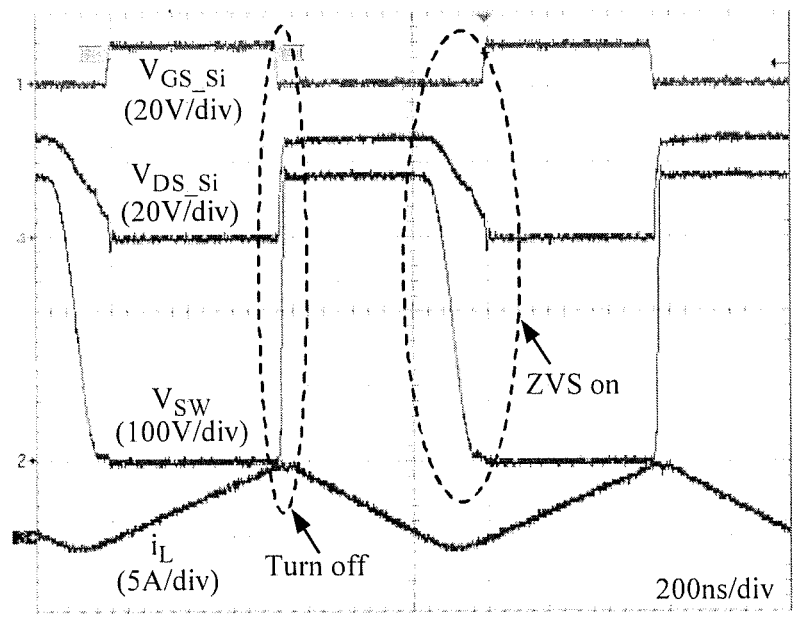
FIG. 9A illustrates experimentally derived waveforms of an otherwise unbalanced cascode device with additional capacitor Ca.
Figure 9B:
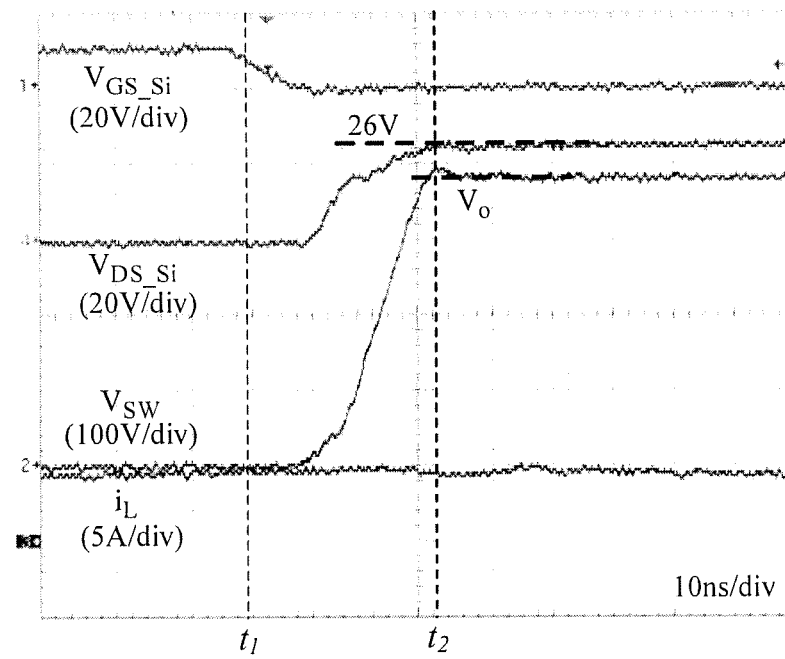
FIGS. 9B and 9C illustrate voltage and current waveforms in FIG. 9A which avoid avalanche and achieve true ZVS turn-on for the high voltage device in a cascode device.
Figure 9C:
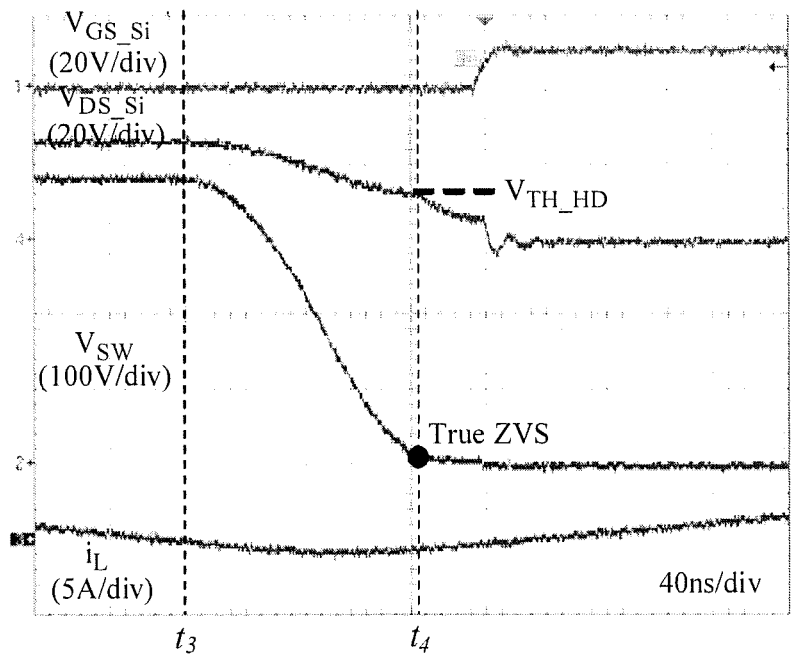

To obtain the experimental waveforms shown in FIGS. 9A-9C, a capacitance of Ca=800 pf was connected as shown in FIG. 7. As shown in FIG. 9B, the avalanche voltage for Si MOSFET (e.g. 30V) is not reached and avalanche conditions do not occur. The turn-off process is completed more rapidly that in the case without Ca. During the soft switching period illustrated in FIG. 9C, the inductor current reaches 0V and begins to resonate at time t3. The drain-source voltage of the Si MOSFET, which is also the gate-source voltage of the high voltage device, decreases rapidly and the high voltage device begins to conduct under ZVS conditions. No internal turn-on loss is induced when Ca is added to the cascode device.

Figure 10:
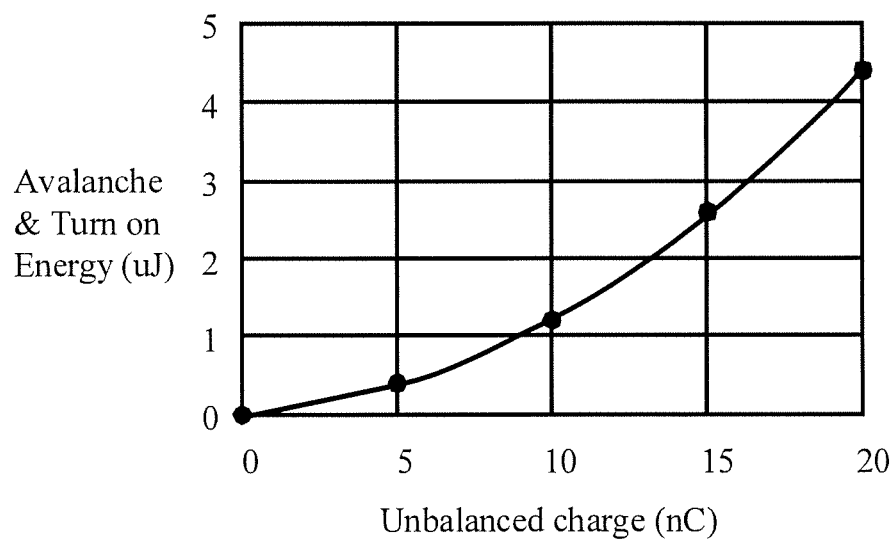
FIG. 10 illustrates the relationship of avalanche and internal switching loss corresponding to unbalanced charge in the cascode device.

To generally quantify the loss induced by unmatched capacitances in the cascode device, FIG. 10 illustrates the relationship of loss and unbalanced charge. As unbalanced charge increases, the avalanche and internal switching loss increases significantly. For example, losses of 4.5 microJoules (µJ) result from only 20 nanoCoulombs (nC) per switching cycle. These losses correspond to 4.5 watts at a switching frequency of 1.0 MHZ.

Figure 11:
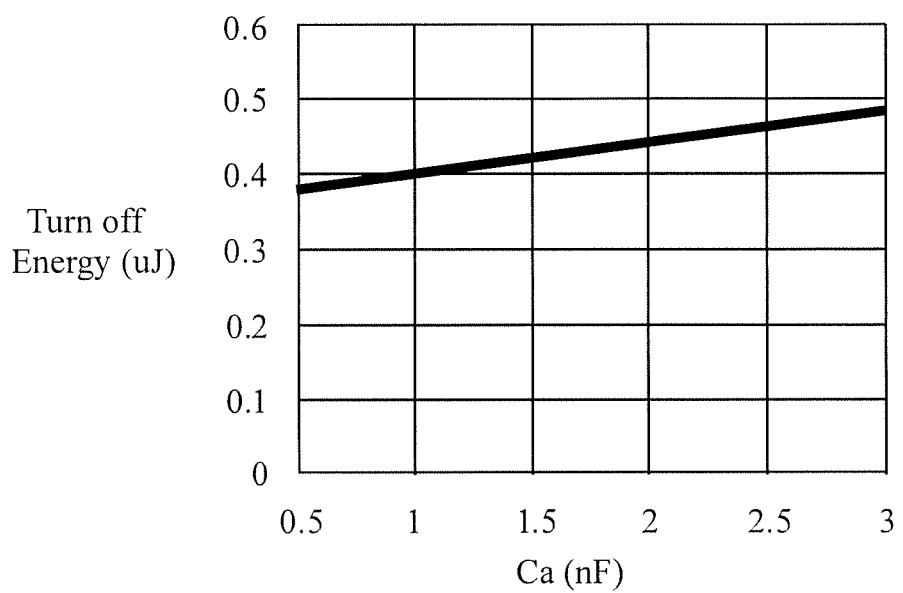
FIG. 11 illustrates the negligible increase of turn-off switching loss due to the additional capacitor Ca in the cascode device.

The effect of adding the additional capacitor to the cascode device is a negligible increase of turn-off switching loss, illustrated in FIG. 11. since the cascode device, itself, inherently exhibits very small turn-off switching loss due to the intrinsic current source turn-off mechanism (the channel current and $C_{DS\_HD}$ current will assist in discharging $C_{GS\_HD}$ during the turn-off transition) which is a principal advantage of a cascode switching device.

In view of the foregoing, it is clearly seen that the invention provides a technique for unconditionally making high voltage, normally-on devices applicable to cascode switches, regardless of parasitic capacitances of the high voltage, normally-on switches and Si MOSFET switches. Furthermore, the simplicity of adding a small, inexpensive capacitor of non-critical value is convenient and well-suited for mass production, particularly where parasitic capacitances are found to be variable from device-to-device. Further, as alluded to above, the invention allows use of cascode switches in power converters of any type and enhances high frequency operation by the significant reduction in switching losses which can be achieved through the invention.

While the invention has been described in terms of a single preferred embodiment, those skilled in the art will recognize that the invention can be practiced with modification within the spirit and scope of the appended claims.

We claim:
1. A cascode switching device including:
   a high voltage, normally-on transistor formed of silicon carbide or a nitride of a Group III material, said high voltage, normally-on transistor having a switching threshold voltage, a drain-source parasitic capacitance, a gate-source parasitic capacitance and a gate-drain parasitic capacitance;
   a control transistor for controlling conduction of said high voltage, normally-on transistor, said control transistor having an avalanche breakdown threshold voltage, a drain-source parasitic capacitance, a gate-source parasitic capacitance and a gate-drain parasitic capacitance; and
   a charge balancing capacitor directly and continuously connected to a first node connecting a source terminal of said high voltage, normally-on transistor and a drain terminal of said control transistor, the first node to be in series with said drain-source parasitic capacitance of said high voltage normally-on transistor, the charge balancing capacitor being directly and continuously connected to a second node connecting a source terminal of said control transistor and a gate terminal of said high voltage, normally on transistor, the charge balancing capacitor further directly connected in par- allel with a parallel connection of said gate-source parasitic capacitance of said high voltage, normally-on transistor and said drain-source parasitic capacitance of said control transistor to form a capacitive voltage divider, said charge balancing capacitor having a value such that:

a voltage on said drain-source parasitic capacitance of said control transistor cannot reach said avalanche breakdown threshold voltage when said drain-source parasitic capacitance of said high voltage, normally-on transistor is charged when said high voltage, normally-on transistor is turned off; and when a voltage across said capacitive voltage divider is reduced, said drain-source parasitic capacitance of said high voltage, normally-on transistor is fully discharged when the voltage on said drain-source parasitic capacitance of said control transistor is reduced to said switching threshold voltage of said high voltage, normally-on transistor, whereby said high voltage, normally-on transistor is switched to a conductive state with near-zero voltage applied across the drain and the source terminals of said high voltage, normally-on transistor.

2. The cascode switching device as recited in claim 1, wherein a sum of capacitances of said charge balancing capacitor and said parallel connection of said gate-source parasitic capacitance of said high voltage, normally-on transistor and said drain-source parasitic capacitance of said control transistor is approximately equal to or greater than said drain-source parasitic capacitance of said high voltage, normally-on transistor.

3. The cascode switching device as recited in claim 1, wherein said high voltage, normally-on transistor is formed of silicon carbide.

4. The cascode switching device as recited in claim 1, wherein said high voltage, normally-on transistor is formed of gallium nitride.

5. The cascode switching device as recited in claim 1, wherein said high voltage, normally-on transistor is a depletion mode, high electron mobility transistor.

6. The cascode switching device as recited in claim 1, wherein said control transistor is a silicon MOSFET.

7. A power converter including a cascode switching device wherein said cascode switching device comprises:

a high voltage, normally-on transistor formed of silicon carbide or a nitride of a Group III material, said high voltage, normally-on transistor having a drain-source parasitic capacitance, a gate-source parasitic capacitance and a gate-drain parasitic capacitance;

a control transistor for controlling conduction of said high voltage, normally-on transistor, said control transistor having an avalanche breakdown threshold voltage, a drain-source parasitic capacitance, a gate-source parasitic capacitance and a gate-drain parasitic capacitance; and a charge balancing capacitor directly and continuously connected to a first node connecting a source terminal of said high voltage, normally-on transistor and a drain terminal of said control transistor, the first node to be in series with said drain-source parasitic capacitance of said high voltage normally-on transistor, the charge balancing capacitor directly and continuously connected to a second node connecting a source terminal of said control transistor and a gate terminal of said high voltage, normally on transistor, the charge balancing capacitor further directly connected in parallel with a parallel connection of said gate-source parasitic capacitance of said high voltage, normally-on transistor and said drain-source parasitic capacitance of said control transistor to form a capacitive voltage divider, said charge balancing capacitor having a value such that:

a voltage on said gate-source parasitic capacitance of said control transistor cannot reach said avalanche breakdown threshold voltage when said drain-source parasitic capacitance of said high voltage, normally-on transistor is charged when said high voltage, normally-on transistor is turned off; and when said drain-source parasitic capacitance of said high voltage, normally-on transistor is fully discharged when the voltage on said drain-source parasitic capacitance of said control transistor is reduced to said switching threshold voltage of said high voltage, normally-on transistor, whereby said high voltage, normally-on transistor is switched to a conductive state with near-zero voltage applied across the drain and the source terminals of said high voltage, normally-on transistor.

8. The power converter as recited in claim 7, wherein a sum of capacitances of said charge balancing capacitor and said parallel connection of said gate-source parasitic capacitance of said high voltage, normally-on transistor and said drain-source parasitic capacitance of said control transistor is approximately equal to or greater than said drain-source parasitic capacitance of said high voltage, normally-on transistor.

9. The power converter as recited in claim 7, wherein said high voltage, normally-on transistor is formed of silicon carbide.

10. The power converter as recited in claim 7, wherein said high voltage, normally-on transistor is formed of gallium nitride.

11. The power converter as recited in claim 7, wherein said high voltage, normally-on transistor is a depletion mode, high electron mobility transistor.

12. The power converter as recited in claim 7, wherein said control transistor is a silicon MOSFET.

13. The power converter as recited in claim 7, wherein said power converter is a boost power converter.

14. A method of operating a cascode switching device comprising:

a high voltage normally-on transistor having a drain-source parasitic capacitance, a gate-source parasitic capacitance and a gate-drain parasitic capacitance;

a charge balancing capacitor; and a control transistor having a drain-source parasitic capacitance, agate-source parasitic capacitance and a gate-drain parasitic capacitance and exhibiting an avalanche breakdown voltage threshold, a source terminal of said high voltage, normally-on transistor being connected to a drain terminal of said control transistor such that said drain-source parasitic capacitance of said high-voltage, normally-on transistor is connected in series with said drain-source capacitance of said control transistor and said charge balancing capacitor connected in parallel with said drain-source parasitic capacitance of said control transistor and said gate-source parasitic capacitance of said control transistor forming a capacitive voltage divider therewith, said method including steps of:

applying a switching signal to the control transistor to charge the drain-source parasitic capacitance of said control transistor and said charge balancing capacitor connected in parallel with said drain-source parasitic capacitance of said control transistor to a voltage above a switching threshold of the high voltage, normally-on transistor;

charging said drain-source parasitic capacitance of said high voltage, normally-on transistor in series with said charge balancing capacitor and said drain-source parasitic capacitance of said control transistor to an operating voltage that produces a voltage less than said avalanche breakdown threshold on said parallel connection of said drain-source parasitic capacitance of said control transistor and said charge balancing capacitor;

discharging said drain-source parasitic capacitance of said high voltage, normally-on transistor to zero volts; and maintaining a voltage on said drain-source parasitic capacitance of said control transistor and said charge balancing capacitor at or above said switching threshold of said high-voltage, normally-on transistor with charge on said charge balancing capacitor and said drain-source parasitic capacitance until said step of discharging said source-drain parasitic capacitance of said high voltage, normally-on transistor to zero volts is complete, whereby zero voltage switching of said high voltage, normally-on transistor is achieved.

15. The method as recited in claim 14, wherein said discharging step is performed using a resonant current.

16. The method as recited in claim 14, wherein said discharging step is performed using an induced current.

\* \* \* \* \*